United States Patent [19]

Kaplow et al.

[11] 4,086,485
[45] Apr. 25, 1978

[54] SOLAR-RADIATION COLLECTION APPARATUS WITH TRACKING CIRCUITRY

[75] Inventors: Roy Kaplow, Newton; Robert I. Frank, Cambridge, both of Mass.

[73] Assignee: Massachusetts Institute of Technology, Cambridge, Mass.

[21] Appl. No.: 690,093

[22] Filed: May 26, 1976

[51] Int. Cl.² .................................................. G01J 1/20
[52] U.S. Cl. ........................... 250/203 R; 136/89 PC; 126/271
[58] Field of Search .................. 136/89 PC; 126/270, 126/271; 250/203; 356/152, 141

[56] References Cited

U.S. PATENT DOCUMENTS

| 2,913,583 | 11/1959 | Regnier et al. | 250/203 R |
| 3,852,714 | 12/1974 | Carson | 250/203 R |
| 3,988,166 | 10/1976 | Bean | 126/271 |

Primary Examiner—Alfred E. Smith
Assistant Examiner—David K. Moore

Attorney, Agent, or Firm—Hopgood, Calimafde, Kalil, Blaustein & Lieberman

[57] ABSTRACT

The invention contemplates improved apparatus for collecting solar radiation and directionally concentrating the same upon utilization means such as a photovoltaic cell system. In the form described, arrayed collecting devices are mounted for individual tracking of maximum solar-energy response at each such cell system, utilizing time-shared access to a microprocessor, and correctional-drive signals uniquely appropriate to the orientation of each collecting device are supplied by the microprocessor on a time-shared basis for the respective components of orientation correction drive means for each collecting device. Since each collecting device is thus automatically correctively positioned for maximum output of its own utilization device, there is an avoidance of precision requirements (a) as to mounting the several collecting devices with respect to each other and (b) as to basic drives to anticipate relative aspect of the sun, as a function of the time of day, or the day of the year, and whatever the earthbound location of the apparatus.

10 Claims, 8 Drawing Figures

U.S. Patent   April 25, 1978   Sheet 1 of 3   4,086,485
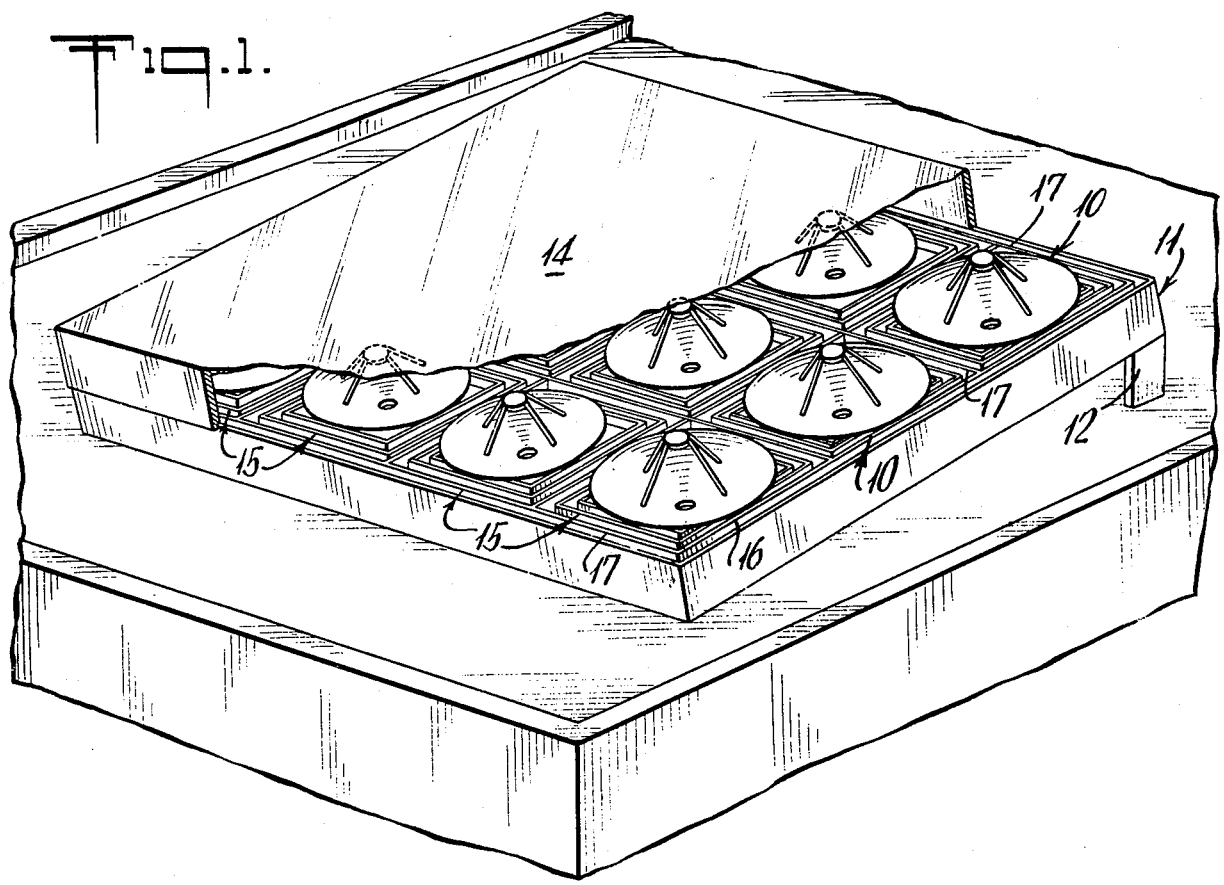
Fig. 1.
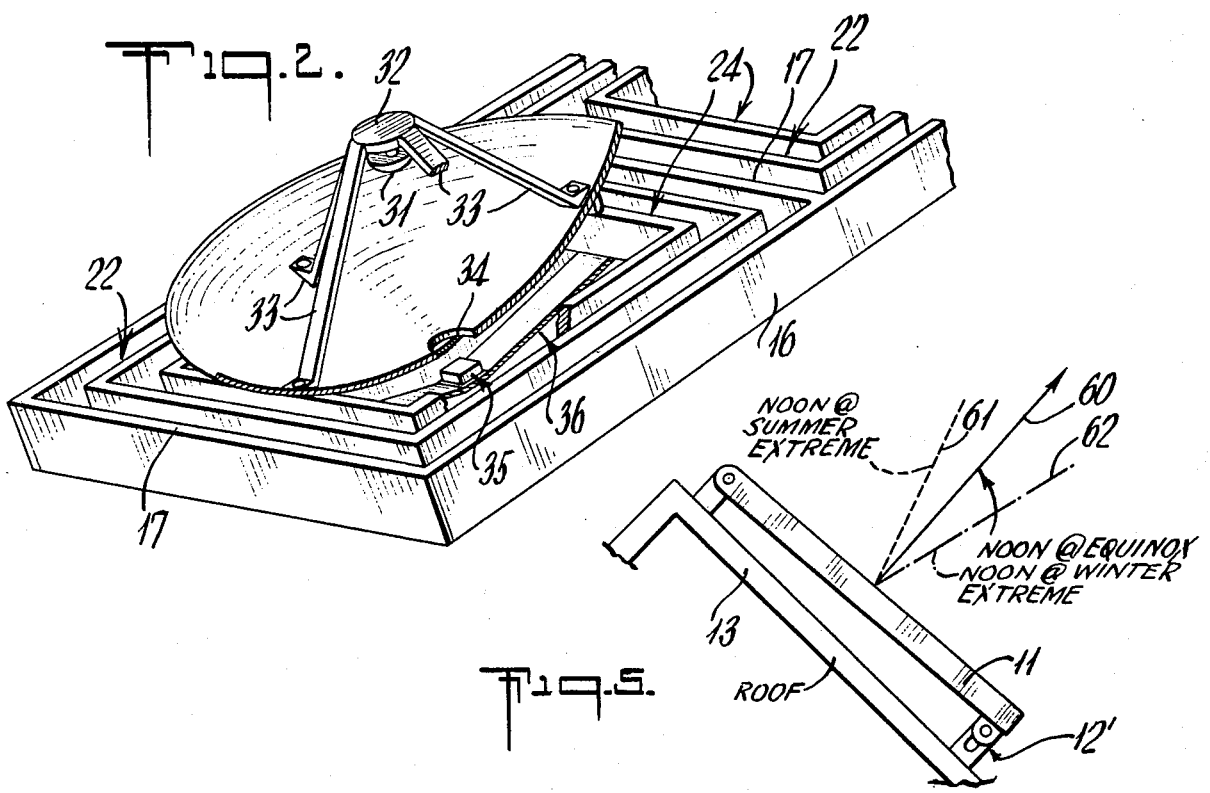
Fig. 2.
Fig. 3.

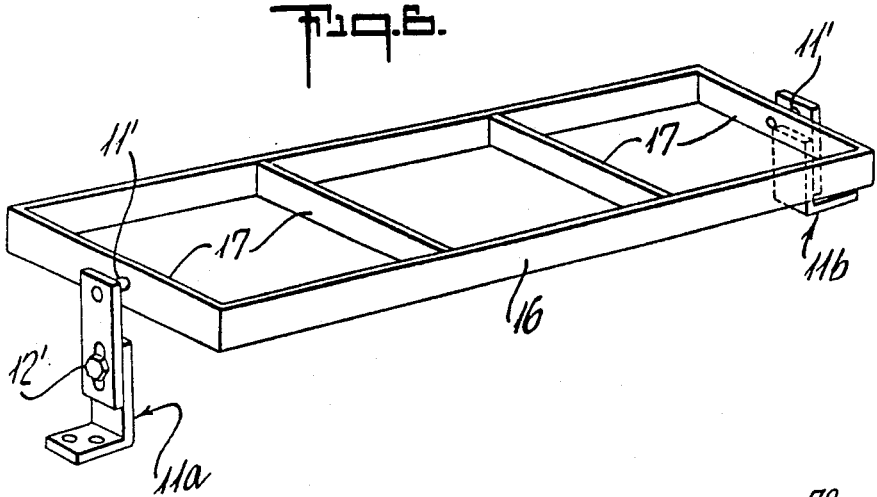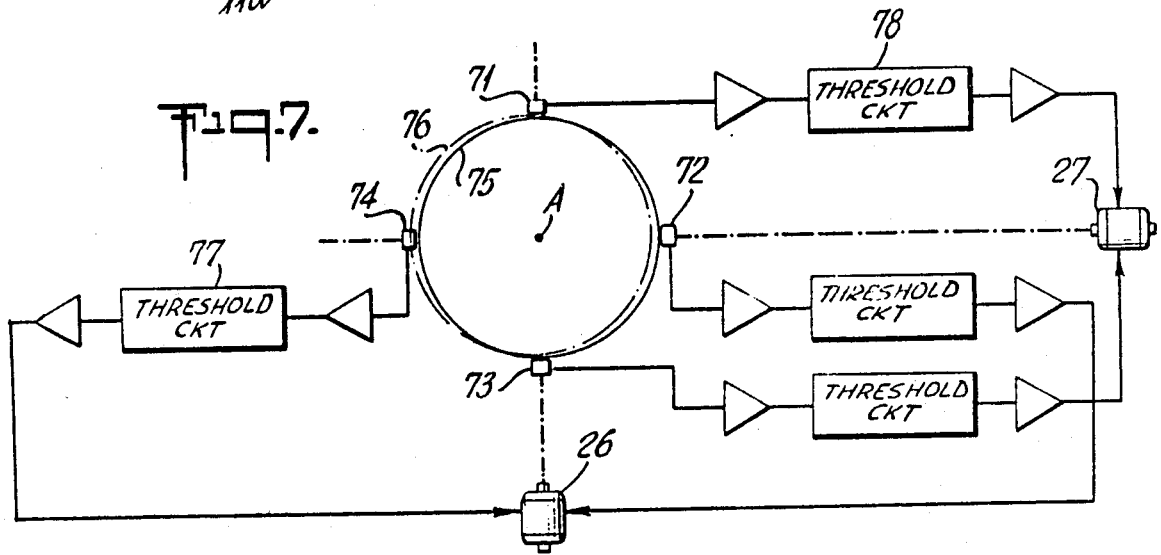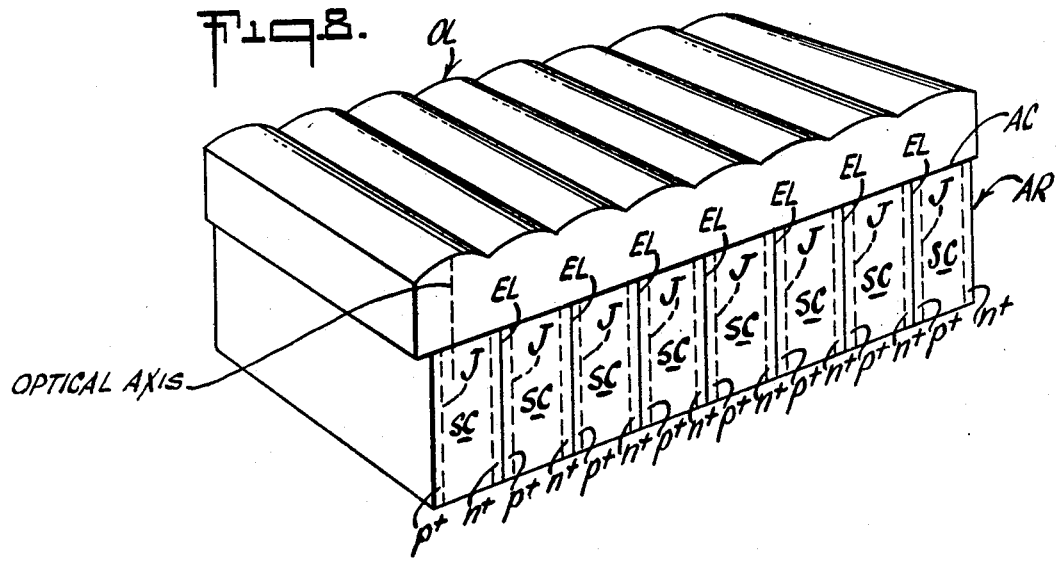

SOLAR-RADIATION COLLECTION APPARATUS WITH TRACKING CIRCUITRY

The invention relates to improved solar-radiation collection apparatus and, in particular, to means for correctively orienting each collecting device of an arrayed plurality of such devices, to the end that maximum collected solar radiation be utilized, or available for utilization.

The need for correct orientation of devices for collection of solar radiation has long been recognized, and various simplifying mechanisms have been proposed, in recognition of the economics of the problem. Generally, all such proposals have required structural rigidity and precise individual prealignment of the elements of the array, and the proposals known to us have had to make substantial compromises with precision, to the end that cost shall not defeat the purpose of the system. And of course, to compromise with precision is arbitrarily to forego the utilization of some of the available energy.

It is an object of the invention to provide improved collection-array apparatus of the character indicated, wherein utmost solar radiation is assuredly collected for a given array, in terms of direct solar radiation.

Another object is to achieve correct precision orientation of each collection unit of an array of the character indicated, without imposing strict specifications as to the precision of mounting or of orienting the array or its component units.

A further object is to achieve the foregoing objects at relative economy, and with inherent durability and reliability of component elements.

It is a specific object to achieve the foregoing objects with structure universally lending itself to relatively simple installation in a variety of mounting situations.

Another specific object is to provide apparatus of the character indicated, lending itself to modular construction and modular installation.

A still further object is to provide an arraypositioning system wherein each element of the array is independently positionable and wherein a single electronic-processing means independently serves the position-sensing and position-correcting requirements of each of the elements of the array.

Other objects and further features of novelty and invention will be pointed out or will become apparent to those skilled in the art from a reading of the following specification in conjunction with the accompanying drawings. In said drawings, which show for illustrative purposes only, a preferred form of the invention:

FIG. 1 is a simplified partly broken-away view in perspective showing a collector array of the invention installed upon a roof;

FIG. 2 is an enlarged perspective view of one collector unit and its mounting, being one of many such units in the array of FIG. 1, and a part of FIG. 2 being broken-away to reveal more of the construction;

FIG. 5 is a simplified view in side elevation for the multiple-element subarray of FIG. 4 and for the aspect indicated by arrows at 2—2 in FIG. 4;

FIG. 6 is a simplified view in perspective of modified subarray mounting structure;

FIG. 7 is a diagram schematically showing modified orientation-drive means; and

FIG. 8 is a perspective view of solar-cell means associated with the collector unit of FIG. 2.

Figure 3:
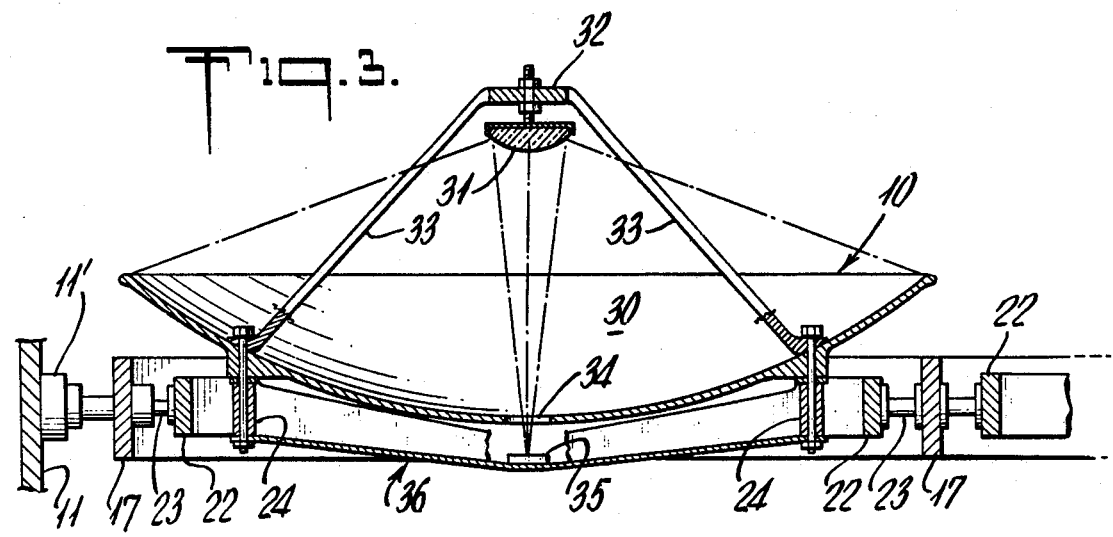
FIG. 3 is a sectional view taken through a collector and mounting of FIG. 2, the section being taken at 2—2 in FIG. 4.

Briefly stated, the present invention dispenses with past requirements for structural rigidity and precise individual alignment of elements in a fixed array, by providing means whereby a single electronic processing means can individually serve the position-sensing and position-correcting requirements of each element of the array, in a pre-programmed sequence. The requirements of mechanical alignment and structural rigidity are circumvented by using electronic sensing and logic to control the motion of each element individually. The sensing signals may be derived from separate sensors at each element of the array; or in the event that the collecting system produces an electrical output, the latter may provide the sensing signals, and the electronic processing equipment may be programmed to provide output control signals for corrective orientation based on maximization of (or maintaining at a fixed value) the desired sensing-signal magnitude.

In FIGS. 1 and 2, a multiple-unit solar-radiation collector array of twelve like collection devices 10 is seen to be mounted and contained within a box-like frame or housing 11, canted as appropriate by legs 12 in its fixed mounting to existing dwelling-roof structure 13. The bottom and upstanding sides of the housing may be of wood, metal or otherwise opaque, being closed by a transparent cover 14, the latter being shown as cup-shaped with top and side walls partly broken-away in FIG. 1, to reveal that the individual collector units 10 are in turn grouped as subarrays 15 of three units. Thus, four subarrays 15 complete the total collection apparatus shown in FIG. 1.

Figure 4:
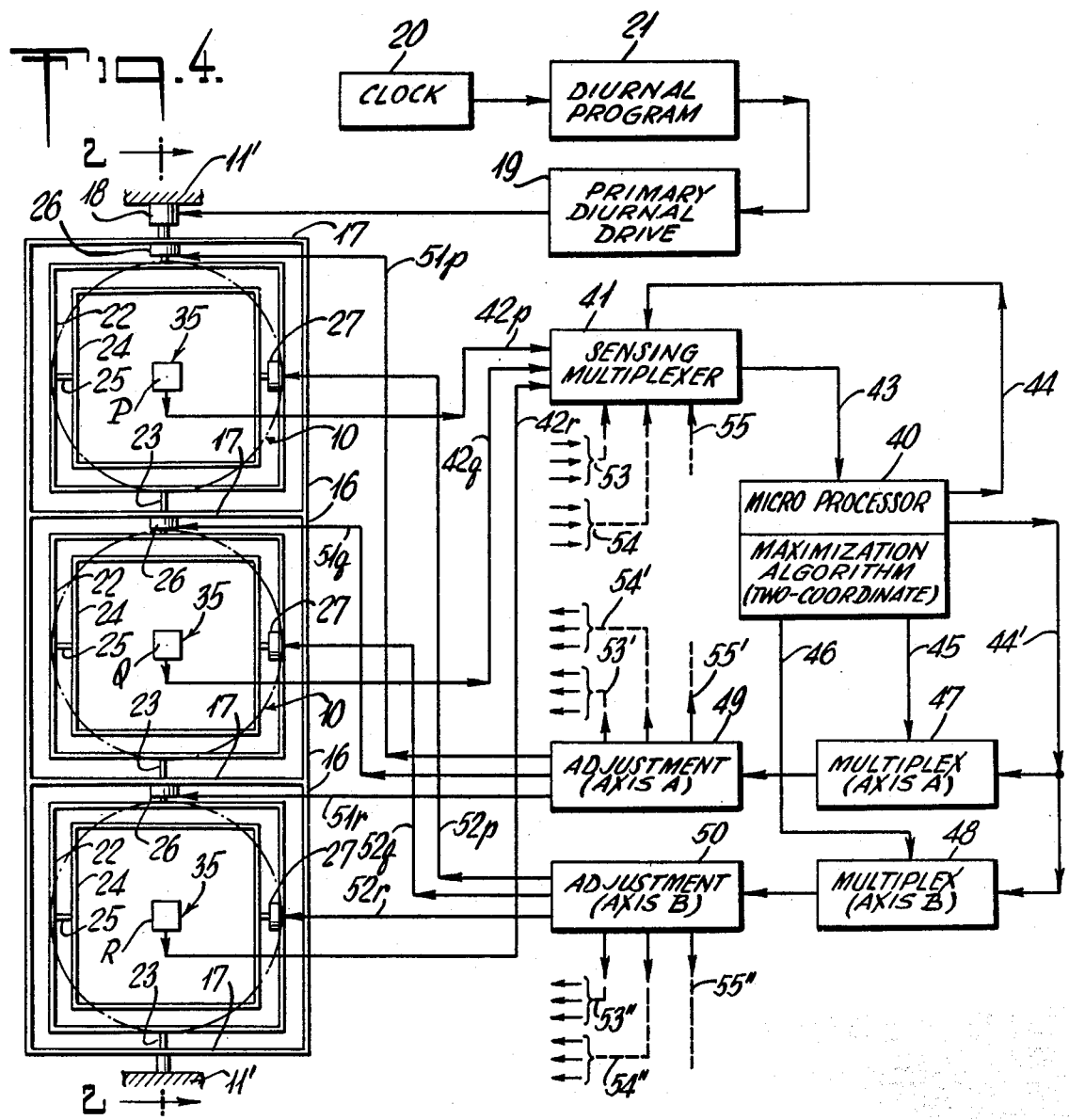
FIG. 4 is a diagram schematically showing collector, sensor, and orientation-drive means for multiple units of the array of FIG. 1.

As shown, each subarray 15 comprises a first elongate rectangular frame consisting of longitudinal members 16 and connecting spacer members 17 at regular intervals; the entire frame 16–17 is seen in FIG. 4 to be pivotally mounted to the housing 11, at bearings 11'. At one of these bearings, drive means 18 is shown to be driven by a primary diurnal drive 19, under control of a clock 20 and suitable program means 21, to the end that the sun shall at all useful daylight hours be approximately in a plane which includes the pivot axis of bearings 11' and which is normal to the plane of frame 16–17.

The spacers 17 are regularly spaced to establish like square frames, for independent two-axis gimbal support of each collector unit 10, three such units (P, Q and R) being shown for the subarray of FIG. 4. Thus, for each unit 10, a first square frame 22 is shown pivotally suspended from and between spacers 17 by means 23 on a first gimbal axis A, on or substantially on the axis of bearings 11'; and a second square frame 24 is similarly suspended from and within frame 22 by shaft means 25 orthogonally related to means 23; the collector means 10 is shown bolted in its mounting to the inner frame 24. To complete the suspension, an outer-gimbal correctional drive means 26 permits correctional displacement (about axis A) for the diurnal orientation component appropriate for each individual collector unit 10; and an innergimbal correctional drive means 27 permits correctional displacement (about axis B) for the seasonal orientation component appropriate for each individual collector unit 10.

Each collector unit 10 is shown to comprise a relatively large dished paraboloidal or spherical primary reflecting element 30 of a Cassegrain-type optical system. The convex secondary reflecting element 31 of the optical system is shown adjustably securable to a supporting platform 32, which in turn is carried by spaced struts 33 anchored to small local regions of the primary element 30. Although a tripod or twolegged mounting is acceptable, we show use of four struts 33 to support platform 32 because this choice enables a single bolt to clamp each strut 33 to the primary element 30 at the precise location where the same bolt secures element 30 to a different one of the sides of frame 24, thus precisely referencing both optical elements 30–31 of each unit 10 directly to the same parts of the same frame 24. A small central opening 34 in the primary element 30 passes convergent radiation to structure 36 secured to frame 24 beneath the backside of element 30. The solar-cell means 35 may be of a variety of types depending upon application requirements; for example means 35 may comprise an array of vertical-junction elements, with associated cylindricallens, array, as disclosed in detail in our copending application, Ser. No. 690,056, filed on even date herewith.

In FIG. 8, such an array AR is shown to comprise plural vertical-junction solar cell elements SC which may be of a semiconductor material, such as silicon. The cell elements SC may be slices of n-type silicon, separated by vertical conductive electrodes EL, as of aluminum. Each of the silicon slices has formed therein, as by diffusion, a vertical $p^+$ region and an $n^+$ region, creating a vertical p-n junction J at the interface between the $p^+$ region and the n-type substrate, and giving rise to the photovoltaic effect, as is known. The p-n junctions J lie in vertical planes which are parallel to each other and which are normal to a common upper surface, which may be coated with an anti-reflection coating AC; and an optical lens structure OL, such as the cylindrical-lens array shown, serves to focus downwardly directed incident light (from secondary mirror 31) into a series of narrow-focused beam lines in the n-type substrate regions, at surface AC and in adjacent but offset relation to the planes of the vertical-junctions J.

To provide an appreciation of scale for the twelve-unit collection apparatus thus far described, we state that in a presently operative model, a subarray frame (16–17) is 10-ft. long by 40-in. wide, and is designed to carry three mirrors (30) of 40-in. diameter. A box (11–14) of the dimensions 20 ft. × 11 ft. × 45 in. will provide sufficient interior volume such that operating clearance is assured between all movable frames, for as much as 90° rotation of all racks out of the horizontal; this assumes the total height of the box to accommodate the width of the subarray frame (16–17).

For collection-unit orientation, we show in FIG. 4 our preference for the use of a single microprocessor 40 programmed grammed with a maximization algorithm to serve each of the two coordinates of corrective displacement, about axis A and about axis B, respectively, and relying upon timemultiplexing of solar-cell outputs and of control signals to drives 26–27 for all units 10, at suitably sequenced intervals. Thus, a sensing multiplexer 41 will be understood to sequentially accept solar-cell electrical-output (e.g., power-output) samplings in lines 42 (p, q and r) and to supply a digitally characterized signal thereof in connections 43 to the microprocessor 40, all under synchronizing control in line 44 from the microprocessor. Under similar synchronizing control in line 44' and using the aforementioned maximizing algorithm, the microprocessor 40 provides separate outputs, in lines 45–46 and via separate multiplexers 47–48, for the respective control devices 49–50 serving the orthogonal corrective-adjustment axes A and B. The three solid-line outputs 51 (p, q and r) of the controlsignal means 49 will be understood to supply appropriate correctional-drive signals, in time interlace, to the individual A-axis drive means 26 for each of the units 10 at P, Q and R; and similarly, the three solid-line outputs 52 (p, q and r) of the control-signal means 50 will be understood to supply appropriate correctional-drive signals, in time interlace, to the individual B-axis drive means 27 for each of the units 10.

It will be understood that the microprocessor 40 and the multiplexing means 41-47-48 may be solid-state digitally operated devices which perform their many individual independent functions in such short intervals as to permit redundancy of cell-output samples, to establish any given component of corrective-control signal output to a given drive means 26–27, the intervals being extremely short compared to the intervals at which such samplings should be taken to assure precision of sun tracking, independently for each of the units at P, Q and R. Indeed, so relatively short is this sampling time that the described devices 40-41-47-48-49-50 serving the units 10 at P, Q and R may also and similarly serve the units 10 not only at all subarrays 15 of total system depicted in FIG. 1, but also at all similar units 10 for one or more further array systems similar to the system of FIG. 1. This extended capability, all in properly synchronized time-sharing commutation, is suggested at further subarray input groupings 53-54-55 of lines to multiplexer 41, at further A-axis subarray control-signal output groupings 53'-54'-55' of lines from control means 49, and at further B-axis subarray control-signal output groupings 53"-54"-55" of lines from control means 50.

A recommended technique for correct sun-exposed installation of the equipment of FIG. 1 upon a roof slope 13 is depicted in the simple elevational diagram of FIG. 5. Having selected a roof slope with a sunny exposure, and depending upon the slope of the roof, adjustable-leg means suggested at 12' is so set that the general plane of the full array in housing 11 is substantially normal to the sun vector 60 at noon under equinox conditions. This represents a fixed housing-frame orientation which is a reasonable compromise between the noon-sun vectors 61–62 at the respective summer and winter extremes. The diurnal program at 21 will be understood to provide a generally faithful progression of continuous advance of frame 16–17 about axis A (the polar axis) at about 15° per hour, via means 18 of the daylight hours, with clockoperated return of frame 16–17 to the programmed sunrise orientation, e.g., at clock-determination of 12 midnight. For all daylight hours, A-axis and B-axis elevational corrections are relatively small and are performed at sufficient frequency to assure optimal (maximized, or predetermined) solar-cell response at all times of usable sunlight, the heat and electric-power output of all cells being utilized or stored, as needed or provided for at means not shown or necessary to the present description.

While the gimbal suspensions have been shown to be contained within a box-like frame 11, with a transparent cover, it will be appreciated that other configurations may be desired or more acceptable, depending upon application. For example, the means 11 really only is needed to support a subarray 15 at its main bearings 11', so that if desired and practical, mere brackets will suffice. Such bracket mountings for a single subarray 15 are shown at 11a and 11b in the simplified subarray suspension shown in FIG. 6, at least one of these brackets being of adjustable elevation, as described at 12' in FIG. 5, and it being further noted that self-aligning bearings are desirable at 11' for accommodation of such adjustment. The entire bracket-mounted structure of FIG. 6 may be encased in a roof-based transparent enclosure or may be installed within the dwelling beneath a transparent roof area, as will be understood.

It will be appreciated that the described electronics including microprocessor 40 has the inherent capacity to check each unit 10 in exceedingly rapid succession, each such check involving mere milliseconds, since no mechanical motions are involved in making the check. Similarly short times are involved to generate signals to start or to stop component gimbal drive motions, in either particular direction. The actual clock time required to make any given correctional displacement (if needed) might take several seconds, i.e., the time elapsed from first detection of a possible misalignment to the time at which it is determined at 40 from repeated and suitably multiplexed samplings that maximization has been restored by a particular motor drive (26–27), such drive being terminated upon such determination; such interval of several seconds will be understood to involve several cycles of on-off-reverse-off for the particular motor to enable traversals of maximum sensing response, as in line 42p, and mechanical inertias (not the microprocessor) are responsible for the time it takes to accomplish a particular corrective displacement. Use of the microprocessor, in conjunction with synchronized and multiplexed sensing and control-signal delivery to the drive motors means that a great number of such drive motors may be concurrently "juggled" or served by the same multiplexed microprocessor.

As a practical matter, the times at which correctional displacements are required are sufficiently spaced, compared to the time required to make the displacements, that drive motors will only be used a very small part of the total daylight hours, even though any given correctional adjustment may involve traversing oscillation to determine and stop at maximum sensed output at 35. And the speed of microprocessor operation is such that many more sampling sources and drives can be handled at 40 than are implied by sampling and drive of the 12-unit array shown. For example, a single microprocessor 40 may serve all array units of all arrays for plural adjacent dwellings, if desired.

As an alternative but less elegant alternative for sensing individual element misalignment and for individually correcting the same, we schematically show in FIG. 7 the employment of four like cell elements 71-72-73-74 carried as by bracket means 36 (FIG. 3) at equal angular spacing around the solar cell 35. Elements 71-72-73-74 are positioned to lie just outside the circle 75 which represents the sun's image as focused by means 30-31 when the optical axis A is aligned with the sun. For any misalignments, as in the case depicted by phantom outline 76, one cell element 74 will become exposed to solar radiation such that its electrical output exceeds a predetermined threshold at 77, thus providing a suitably amplified control signal (e.g., an "ON" control signal) governing corrective drive by the gimbal motor 26, in the component direction returning the sun's image to the axially centered locus 75. Concurrently, the impact of solar radiation upon a second cell 71 may or may not have developed a cell output exceeding a like predetermined threshold at 78; once the threshold at 78 is exceeded, a similar control signal governs the orthogonally related corrective drive of gimbal motor 27, in the component direction also returning the sun's image to the locus 75. Similar but oppositely directed corrective drives result from sufficient solar radiation incident upon either or both of the remaining cell elements, appropriate to correct such misalignment as may be involved. It will be appreciated that, aside from the use of multiple detectors at 71-72-73-74, the system of FIG. 7 illustrates the inverse of the system of FIG. 4, in the sense that in FIG. 4 maximized light is the criterion for optical-axis alignment with the sun, whereas in FIG. 7 zero or minimum light (at elements 71-72-73-74) is the criterion for such optical-axis alignment.

It will be seen that the described tracking system meets all stated objects and that while it may have other applications, it is particularly suited to individual-element orientation in a multiple-element solar-radiation collection array. All corrective motions are inherently small, even if the multiplexed samplings are taken at half-hour intervals; and motors, gears, etc. used in applying the corrective displacements do not need to be highly precise, nor do elongate frames 16–17 have to be free of bending deflection, since the sensing technique will automatically correct for any irregularities (within limits) in the drive components. By the same token, the gimbal bearings, shafts and the like for movable suspension of each element of the array, also do not need to be precise; friction in such suspension can be put to good use in assuring against any motional displacement unless called for (i.e., in the relatively long dwell periods between corrective displacements), or if desired a clutch-brake feature may be embodied in each component drive system to assure retention of position unless motion is being applied purposely.

The speed of state-of-the-art electronic circuitry is sufficient that many individual units 10 can be positioned sequentially, without any unit accumulating a significant error. Sequencing has the advantage that the majority of the sensor-relevant electronics, the control logic, and the drive electronics do not have to be duplicated for each unit, but can be multiplexed among them. Further, it is possible to configure drive mechanisms such that only a small number of drive motions (even only one) can accomplish all of the needed corrective motions, with clutches or solenoids engaging each motion in turn from a common driving belt, wire, lever, push-rods or other medium. Further, with appropriate control logic and the use of electrically (digitally) stepped drive motors the actuation timing precision of such clutches or solenoids is also of no importance (within limits).

While the invention has been described in detail for the preferred forms shown, it will be understood that modifications may be made without departing from the claimed invention.

We claim:

1. Solar-radiation collection apparatus, comprising frame structure adapted for fixed mounting, a first gimbal frame pivotally mounted to said fixed frame structure and predicted-drive means for imparting predicted diurnal rotation to said gimbal frame with respect to said fixed frame, a plurality of spaced radiation-collecting optical systems each having a two-axis gimbal suspension with respect to a different spaced location on said first gimbal frame, separate correctional-drive means associated with each of the axes of each of said two-axis gimbal suspensions, a radiationresponsive cell independently carried by each gimbal suspension and aligned with the optical axis of the collecting system associated therewith, microprocessor means for evaluating the output of a given cell and for generating two-component output signals for correctional application to the respective correctional drive means of said given cell, whereby to use the output of the given cell to correctionally drive its gimbal system in approach to optimal alignment with the sun, first multiplexing means sequentially and periodically associating the respective cell outputs with said microprocessor means, and second multiplexing means sequentially and periodically associating with the output signals of said microprocessor means the separate correctional-drive means for the gimbal suspensions of the respective cells.

2. Solar-radiation collection apparatus, according to claim 1, in which said first gimbal frame is elongate in the direction of the diurnal drive axis and in which said gimbal suspensions are mounted to said first gimbal frame in longitudinally spaced array, one axis of each gimbal suspension being in general alignment with the diurnal-rotation axis of said first gimbal frame.

3. Solar-radiation collection apparatus according to claim 1, in which each collection system is a Cassegrain-type system comprising a primary mirror and secondary mirror, with an associated cell, said cell and mirrors being fixedly mounted with respect to each other.

4. Solar-radiation collection apparatus according to claim 1, in which each said radiation-responsive cell is photovoltaic, whereby said microprocessor means may respond to the electrical output of each said cell.

5. Solar-radiation collection apparatus according to claim 4, in which each said cell comprises a multilayer array of vertical-junction cell elements having parallel junction planes which terminate in spaced parallel relation at one end plane of said array, said end plane being normal to the collecting optical axis near the focal region thereof, and an array of cylindrical lenses arrayed at said end plane with parallel spaced elongation axes which correspond in number and in spacing to said junction planes.

6. Solar-radiation collection apparatus, comprising frame structure adapted for fixed mounting, a plurality of spaced radiation-collecting optical systems carried by said frame with each optical system having its own two-axis gimbal suspension, separate correctional-drive means associated with each of the axes of each of said two-axis gimbal suspensions, a radiation-responsive cell independently carried by each gimbal suspension and aligned with the optical axis of the collecting system associated therewith, microprocessor means for evaluating the output of a given cell and for generating two-component output signals for correctional application to the respective correctional-drive means of said given cell, whereby to use the output of the given cell to correctionally drive its gimbal system in approach to optimal alignment with the sun, first multiplexing means sequentially and periodically associating the respective cell outputs with said microprocessor means, and second multiplexing means sequentially and periodically associating with the output signals of said microprocessor means the separate correctional-drive means for the gimbal suspensions of the respective cells.

7. Solar-radiation collection apparatus, comprising frame structure adapted for fixed mounting, a first gimbal frame pivotally mounted to said fixed frame structure on a first gimbal axis, predicted-drive means for imparting predicted diurnal rotation to said gimbal frame about said first axis and with respect to said fixed frame, a plurality of spaced radiation-collecting optical systems each having a gimbal suspension with respect to a different spaced location on said first gimbal frame, each of said gimbal suspensions including a second gimbal axis that is orthogonal to said first axis, separate correctional-drive means associated with each of said second gimbal suspensions, a radiation-responsive cell independently carried by each gimbal suspension and aligned with the optical axis of the collecting system associated therewith, microprocessor means for evaluating the output of a given cell and for generating an output signal for correctional application to the correctional-drive means of said given cells, whereby to use the output of the given cell to correctionally drive its second-axis gimbal system in approach to optimal alignment with the sun, first multiplexing means sequentially and periodically associating the respective cell outputs with said microprocessor means, and second multiplexing means sequentially and periodically associating with the output signals of said microprocessor means the separate correctional-drive means for the gimbal suspensions of the respective cells.

8. Solar-radiation collection apparatus, comprising a plurality of radiation-collecting optical systems each having its own two-axis gimbal suspension and being adapted for fixed mounting in spaced relation such that each collecting optical system has independent solar exposure, separate correctional-drive means associated with each of the axes of each of said two-axis gimbal suspensions, a radiation-responsive cell independently carried by each gimbal suspension and aligned with the optical axis of the collecting system associated therewith, microprocessor means for evaluating the output of a given cell and for generating two-component output signals for correctional application to the respective correctional drive means of said given cell, whereby to use the output of the given cell to correctionally drive its gimbal system in approach to optimal alignment with the sun, first multiplexing sequentially and periodically associating the respective cell outputs with said mircoprocessor means, and second multiplexing means sequentially and periodically associating with the output signals of said microprocessor means the separate correctional-drive means for the gimbal suspensions of the respective cells.

9. Solar-radiation collection apparatus, comprising frame structure adapted for fixed mounting, a plurality of first gimbal frames pivotally mounted to said fixed frame structure on spaced parallel axes, a single predicted-drive means connected to impart predicted diurnal rotation to each of said gimbal frames with respect to said fixed frame, a plurality of spaced radiation-collecting optical systems carried by each of said first gimbal frames, each optical system having its own two-axis gimbal suspensions with respect to a different spaced location on its associated first gimbal frame, separate correctional-drive means associated with each of the axes of each of said two-axis gimbal suspensions, a radiation-responsive cell independently carried by each gimbal suspension and aligned with the optical axis of the collecting system associated therewith, microprocessor means for evaluating the output of a given cell and for generating two-component output signals for correctional application to the respective correctional drive means of said given cell, whereby to use the output of the given cell to correctionally drive its gimbal system in approach to optimal alignment with the sun, first multiplexing means sequentially and periodically associating the respective cell outputs with said microprocessor means, and second multiplexing means sequentially and periodically associating with the output signals of said microprocessor means the separate correctional-drive means for the gimbal suspensions of the respective cells.

10. Solar-radiation collection apparatus, comprising frame structure adapted for fixed mounting, a plurality of first gimbal frames pivotally mounted to said fixed frame structure on spaced parallel first axes, predicted-drive means for imparting predicted diurnal rotation to each of said gimbal frames about said first axes and with respect to said fixed frame, a plurality of spaced radiation-collecting optical systems carried by each of said first gimbal frames, each optical system having a gimbal suspension with respect to a different spaced location on its associated first gimbal frame, each of said gimbal suspensions including a second gimbal axis that is othogonal to said first axes, separate correctionaldrive means associated with each of said second gimbal suspensions, a radiation-responsive cell independently carried by each gimbal suspension and aligned with the optical axis of the collecting system associated therewith, microprocessor means for evaluating the output of a given cell and for generating an output signal for correctional application to the correctional drive means of said given cell, whereby to use the output of the given cell to correctionally drive its second-axis gimbal system in approach to optimal alignment with the sun, first multiplexing means sequentially and periodically associating the respective cell outputs with said microprocessor means, and second multiplexing means sequentially and periodically associating with the output signals of said microprocessor means the separate correctional-drive means for the gimbal suspensions of the respective cells.

* * * * *